US006826282B1

(12) United States Patent
Pachet et al.

(10) Patent No.: US 6,826,282 B1
(45) Date of Patent: Nov. 30, 2004

(54) MUSIC SPATIALISATION SYSTEM AND METHOD

(75) Inventors: Francois Pachet, Paris (FR); Luc Steels, Paris (FR); Olivier Delerue, Paris (FR)

(73) Assignee: Sony France S.A., Clichy la Garenne (FR)

( * ) Notice: Subject to any disclaimer, the term of this patent is extended or adjusted under 35 U.S.C. 154(b) by 0 days.

(21) Appl. No.: 09/318,427

(22) Filed: May 25, 1999

(30) Foreign Application Priority Data

May 27, 1998 (EP) ........................................ 98401266

(51) Int. Cl.[7] ........................................ H03G 3/00

(52) U.S. Cl. ........................................ 381/61; 381/310

(58) Field of Search ........................................ 381/61, 63, 17, 381/18, 1, 310

(56) References Cited

U.S. PATENT DOCUMENTS

| | | | | |
|---|---|---|---|---|
| 5,261,043 A | | 11/1993 | Wolber et al. | |
| 5,715,318 A | * | 2/1998 | Hill et al. | 381/300 |
| 6,011,851 A | * | 1/2000 | Connor et al. | 381/17 |
| 6,160,573 A | * | 12/2000 | Allen et al. | 348/14.08 |

FOREIGN PATENT DOCUMENTS

| | | |
|---|---|---|
| DE | 196 34 155 A | 2/1997 |
| FR | 2 746 247 A | 9/1997 |
| GB | 2 294 854 A | 5/1996 |
| WO | 91 03797 A | 3/1991 |
| WO | 91 13497 A | 9/1991 |

* cited by examiner

*Primary Examiner*—Ping Lee
(74) *Attorney, Agent, or Firm*—Frommer Lawrence & Haug LLP; William S. Frommer; Bruno Polito

(57) ABSTRACT

A storage unit stores data representative of one or several sound sources and a listener of said sound sources. These data comprise position data corresponding to respective positions of the sound sources and the listener. An interface is provided for enabling a user to select the listener or a sound source and to control a change in the position data corresponding to the selected listener or sound source. A constraint solver means changes, in response to the position data change controlled by the user, at least some of the position data corresponding to the element(s), among the listener and the sound sources, other than said selected listener or sound source, in accordance with predetermined constraints. The system further comprises a command generator for delivering control data exploitable by a music spatialisation unit as a function of the position data corresponding to the sound sources and the listener.

22 Claims, 6 Drawing Sheets

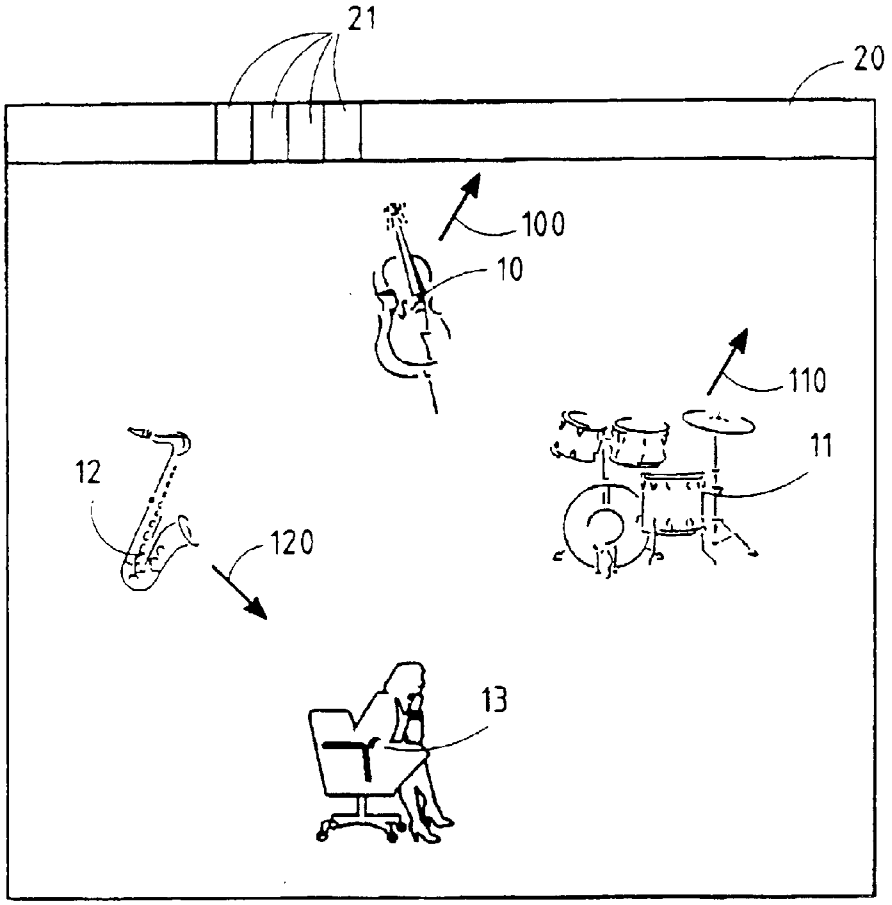
FIG.3
FIG.4
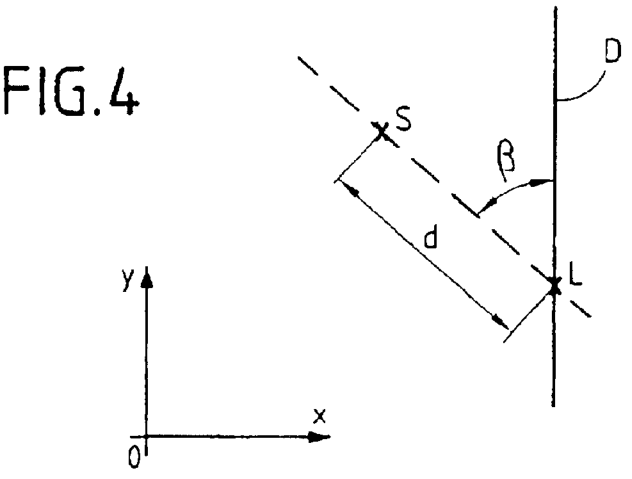

(Propagate Inequality Constraint (C)

(Propagate Functional Constraint (C,V))

FIG.6
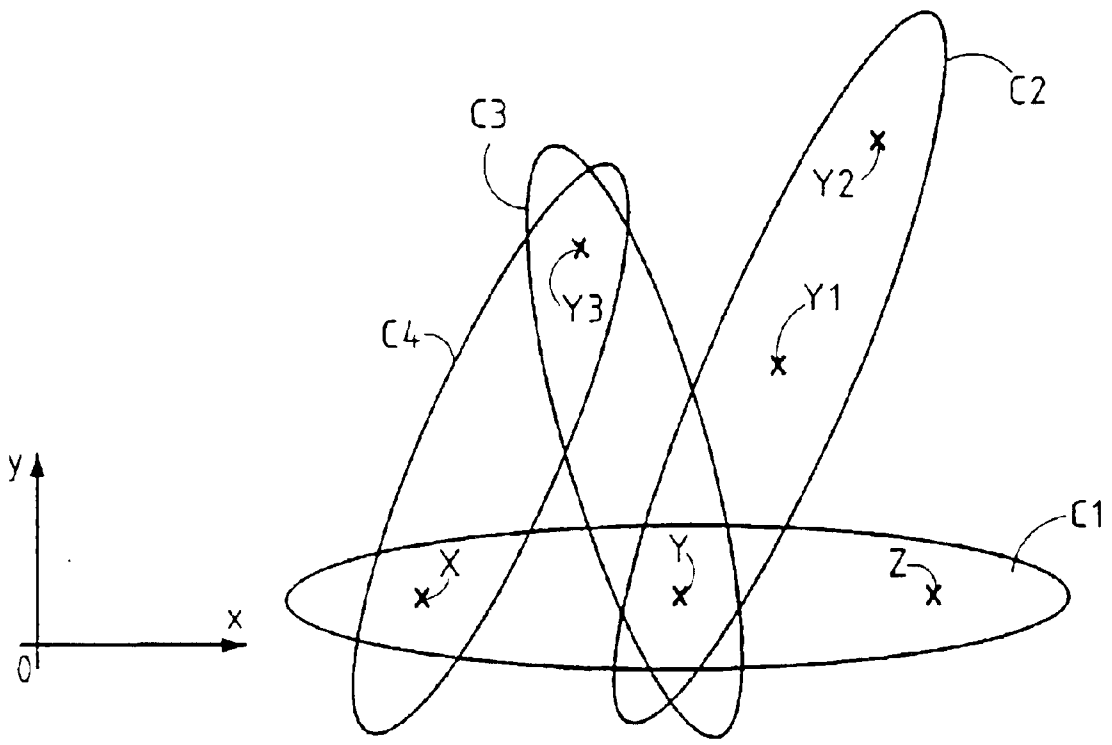
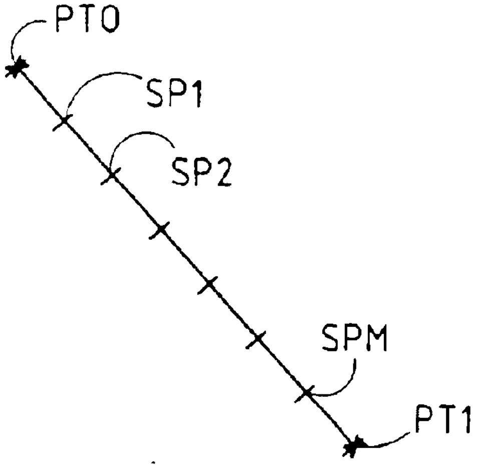
FIG.7

MUSIC SPATIALISATION SYSTEM AND METHOD

The present invention generally pertains to music spatialisation. More specifically, the present invention relates to a music spatialisation system and a music spatialisation method which take account of the positions of different sound sources with respect to a listener for controlling the spatial characteristics of a music produced by the sound sources.

Several music spatialisation systems are known in the art. Most of them simulate, by way of a software, acoustic environments for existing sound signals. These systems are based on results in psychoacoustics that allow to model the perception of sound sources by the human ear using a limited number of perceptive parameters. The models have led to techniques allowing to recreate impression of sound localisation using a limited number of loudspeakers. These techniques typically exploit difference of amplitude in sound channels, delays between sound channels to account for interaural distances, and sound filtering techniques such as reverberation to recreate impressions of distance.

The spatialisation system "SPAT" (registered trademark) by the IRCAM (Institut de Recherche et Coordination Acoustique/Musique) is a virtual acoustic processor that allows to define the sound scene as a set of perceptive factors such as azimuth, elevation and orientation angles of sound sources relatively to the listener. This processor can adapt itself to a sound reproduction device, such as headphones, pairs of loudspeakers, or collections of loudspeakers, for reproducing a music based on these perceptive factors.

The above-mentioned spatialisation techniques have the drawback that the consistency of music is not always maintained upon changing the spatial characteristics of the music.

The present invention aims at remedying this drawback, and providing a system which enables to modify in real-time the positions of various sound sources and a listener in a sound scene, thereby modifying the spatial characteristics of the music produced by the sound sources, while maintaining consistency of the music.

For this purpose there is provided a system for controlling a music spatialisation unit, characterised in that it comprises:

- storage means for storing data representative of one or several sound sources and a listener of said sound sources, said data comprising position data corresponding to respective positions of the sound sources and the listener,
- interface means for enabling a user to select the listener or a sound source and to control a chance in the position data corresponding to the selected listener or sound source,
- constraint solver means for changing, in response to the position data change controlled by the user, at least some of the position data corresponding to the element (s), among the listener and the sound sources, other than said selected listener or sound source, in accordance with predetermined constraints, and
- means for delivering control data exploitable by a music spatialisation unit as a function of the position data corresponding to the sound sources and the listener.

Thus, according to the present invention, predetermined constraints are imposed on the positions of the listener and/or the sound sources in the sound scene. Thanks to these constraints, desired properties for the music produced by the sound sources can be preserved, even, for instance, after the position of a sound source has been modified by the user.

Typically, the music spatialisation unit is a remote controllable mixing device for mixing musical data representative of music pieces respectively produced by the sound sources.

Preferably, the interface means comprises a graphical interface for providing a graphical representation of the listener and the sound sources, and means for moving the listener and/or the sound sources in said graphical representation in response to the position data change controlled by the user and/or the position data change(s) performed by the constraint solver means.

Advantageously, the interface means further comprises means for enabling the user to selectively activate or deactivate the predetermined constraints. The constraint solver means then takes account only of the constraints that have been activated by the user.

In order to render the system according to the present invention immediately reactive, the interface means also comprises means for sampling the position data change controlled by the user into elementary position data changes and for activating the constraint solver means each time an elementary position change has been controlled by the user.

Typically, the predetermined constraints comprise at least one of the following constraints: a constraint specifying that the respective distances between two given sound sources and the listener should always remain in the same ratio; a constraint specifying that the product of the respective distances between each sound source and the listener should always remain constant; a constraint specifying that a given sound source should not cross a predetermined radial limit with respect to the listener; and a constraint specifying that a given sound source should not cross a predetermined angular limit with respect to the listener.

Typically, the constraint solver means performs a constraint propagation algorithm having said position data as variables for changing said at least some of the position data. According to the present invention, the constraint propagation algorithm is a recursive algorithm wherein:

- inequality constraints are merely checked;
- for each functional constraint, in response to a change in the value of one of the variables involved by the constraint, the other variables involved by the constraint are given arbitrary values such that the constraint be satisfied;
- a variable that has been given an arbitrary value at a given step of the algorithm will not change value at any further step thereof; and
- if, at a given step of the algorithm, an inequality constraint is not satisfied, or a functional constraint cannot be satisfied in view of an arbitrary value previously given to one of its variables, the algorithm is ended and the position data change controlled by the user is refused.

The control data depend on the position of each sound source with respect to the listener. More specifically, the control data comprise, for each sound source: a volume parameter depending on the distance between said each sound source and the listener, and a panoramic parameter depending on an angular position of said each sound source with respect to the listener.

The present invention further relates to a music spatialisation system for controlling the spatial characteristics of a music produced by one or several sound sources, characterised in that it comprises: a system as defined above for producing control data depending on the respective positions of the sound sources and a listener of said sound sources, and a spatialisation unit for mixing predetermined musical data representative of music pieces respectively produced by the sound sources as a function of said control data.

The music spatialisation system can further comprise a sound reproducing device for reproducing the mixed musical data produced by the spatialisation unit.

The present invention further relates to a method for controlling a music spatialisation unit, characterised in that it comprises the following steps:

storing data representative of one or several sound sources and a listener of said sound sources, said data comprising position data corresponding to respective positions of the sound sources and the listener, enabling a user to select the listener or a sound source and to control a change in the position data corresponding to the selected listener or sound source through an interface means, changing, in response to the position data change controlled by the user, at least some of the position data corresponding to the element(s), among the listener and the sound sources, other than said selected listener or sound source, in accordance with predetermined constraints, and delivering control data exploitable by a music spatialisation unit as a function of the position data corresponding to the sound sources and the listener.

The present invention further relates to a music spatialisation method for controlling the spatial characteristics of a music produced by one or several sound sources, characterised in that it comprises:

a method as defined above for producing control data depending on the respective positions of the sound sources and a listener of said sound sources, and a spatialisation step for mixing predetermined musical data representative of music pieces respectively produced by said sound sources as a function of said control data.

Other features and advantages of the present invention will be made more apparent in the following detailed description with reference to the appended drawings in which:

FIG. 3 is a diagram showing a display on which the sound scene of FIG. 2 is represented;

FIG. 4 is a diagram showing how numeric parameters for a spatialisation unit illustrated in FIG. 1 are calculated;

FIG. 6 is a diagram illustrating a propagation step of the algorithm of FIGS. 5A to 5E; and FIG. 7 is a diagram showing a position change sampling performed by an interface illustrated in FIG. 1.

Figure 1:
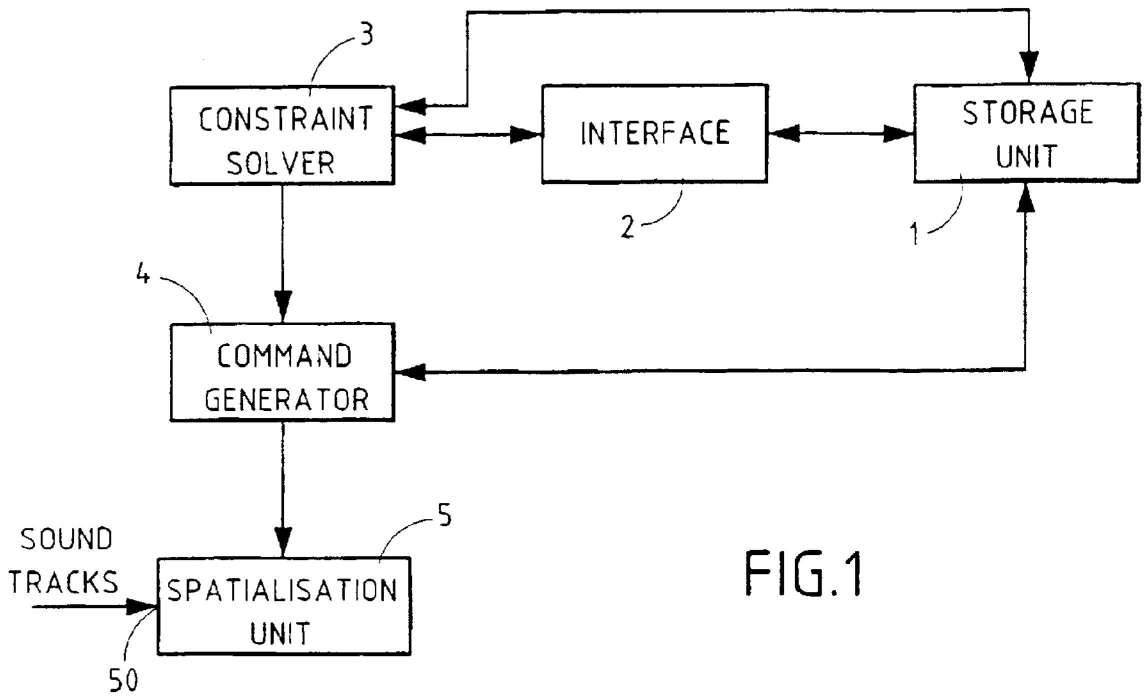
FIG. 1 is a block-diagram showing a music spatialisation system according to the present invention.

FIG. 1 illustrates a music spatialisation system according to the present invention. The system comprises a storage unit 1, a user interface 2, a constraint solver 3, a command generator 4 and a spatialisation unit 5.

Figure 2:
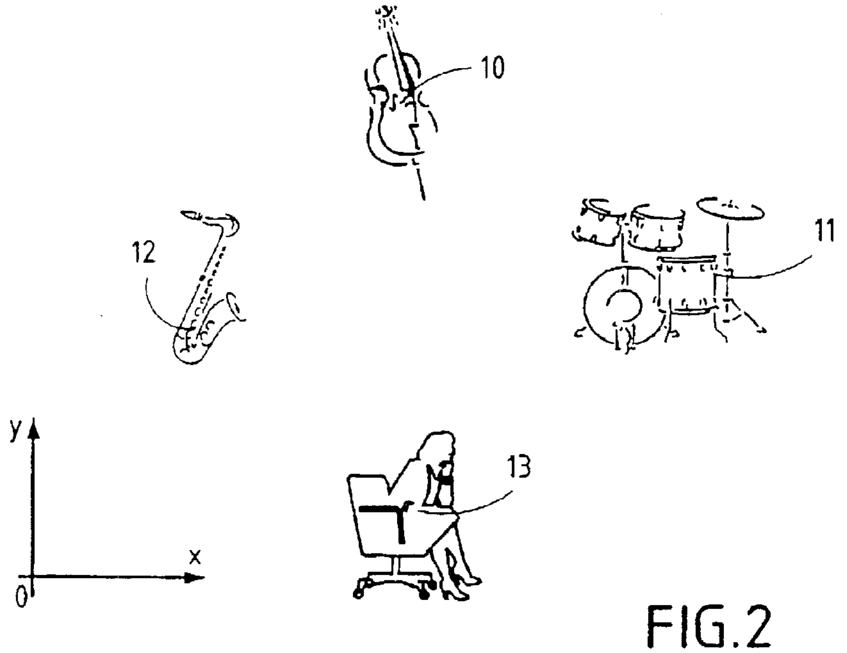
FIG. 2 is a diagram showing a sound scene composed of a musical setting and a listener.

The storage unit, or memory unit, 1 stores numerical data representative of a musical setting and a listener of said musical setting. The musical setting is composed of several sound sources, such as musical instruments, which are separated from each other by predetermined distances. FIG. 2 diagrammatically shows an example of such a musical setting. In this example, the musical setting is formed of a bass 10, drums 11 and a saxophone 12. The storage unit 1 stores the respective positions of the sound sources 10, 11 and 12 as well as the position of a listener 13 in a two-dimensional referential (O,x,y). The listener as illustrated in FIG. 2 is positioned in front of the musical setting 10–12, and, within the musical setting, the bass 10 is positioned behind the drums 11 and the saxophone 12.

The interface 2 comprises a display 20, shown in FIG. 3, for providing a graphical representation of the musical setting 10–12 and the listener 13. The listener 13 and each sound source 10–12 of the musical setting are represented by graphical objects on the display 20. In FIG. 3, each graphical object displayed by the display 20 is designated by the same reference numeral as the element (listener or sound source, as shown in FIG. 2) it represents.

The interface 2 further comprises an input device (not shown), such as a mouse, for enabling a user to move the graphical objects of the listener 13 and the various sound sources 10–12 of the musical setting with respect to each other on the display. When the position of the graphical object of the listener 13 or a sound source 10–12 on the display 20 is modified by the user, the interface 2 provides the constraint solver 3 with data representative of the modified position.

The constraint solver 3 stores a constraint propagation algorithm based on predetermined constraints involving the positions of the listener and the sound sources. The predetermined constraints correspond to properties that should satisfy the music produced by the sound sources 10–12 as it is listened by the listener 13. More specifically, the predetermined constraints are selected so as to maintain consistency of the music produced by the sound sources. Initially, i.e. when the music spatialisation system is turned on, the positions of the listener 13 and the sound sources 10–12 are such that they satisfy all the predetermined constraints.

When receiving the position of the graphical object that has been modified by the user through the interface 2, the constraint solver 3 considers this change as a change in the position, in the referential (O,x,y), of the element, namely the listener or a sound source, represented by this graphical object. The constraint solver 3 then calculates new positions in the referential (O,x,y) for the other elements, i.e. the listener and/or sound sources that have not been moved by the user, so as to ensure that some or all of the predetermined constraints remain satisfied.

The new positions of the sound sources 10–12 and the listener 13 which result from the position change carried out by the user and the performance of the constraint propagation algorithm by the constraint solver 3 are transmitted from the constraint solver 3 to the command generator 4. In response, the command generator 4 calculates numeric parameters exploitable by the spatialisation unit 5. The numeric parameters are for instance the volume and the panoramic (stereo) parameter of each sound source. With reference to FIG. 4, these numeric parameters are calculated as shown herebelow for a given sound source, designated by S, in the musical setting:

$$\text{Volume}(S)=Cst-d$$

where Cst is a predetermined constant, and d is the distance, in the referential (O,x,y), between the sound source S and the listener, designated in FIG. 4 by L; and $$\text{Panoramic parameter}(S)=Cst'\times\text{cosinus}(\beta)$$

where Cst' is a predetermined constant, and βis the angle defined by the sound source S, the listener L, and a straight line D parallel to the ordinate axis y of the referential (O,x,y).

The new positions determined by the constraint solver 3 are also transmitted to the interface 2 which updates the arrangement of the graphical objects 10 to 13 on the display 20. The user can thus see the changes made by the constraint solver 3 in the positions of the listener and/or sound sources.

The spatialisation unit 5 can be a conventional one, such as a remote controllable mixing device or the spatialiser SPAT (Registered Trademark) by the IRCAM. Typically, the spatialisation unit 5 receives at an input 50 different sound tracks, such as for instance a first sound track representative of music produced by the bass 10, a second sound track representative of music produced by the drums 11 and a third sound track representative of music produced by the saxophone 12. The spatialisation unit 5 mixes the music information contained in the various sound tracks based on the numeric parameters received from the command generator 4. The spatialisation unit 5 is connected to a sound reproducing device (not shown) which notably comprises loudspeakers. The sound reproducing device receives the musical information mixed by the spatialisation unit 5, thereby reproducing the music produced by the musical setting as it is listened by the listener 13.

The music spatialisation system of the present invention operates in real-time. Upon turning on the spatialisation system, the musical information output by the spatialisation unit 5 corresponds to the respective positions of the sound sources 10–12 and the listener 13 as stored in the storage unit 1 and as originally to displayed on the display 20. The constraint solver 3 is activated each time the position of a graphical object on the display 20 is moved by the user. The constraint solver 3 determines new positions for the listener and/or the sound sources and transmits these new positions in real-time to the command generator 4. Therefore, upon a position change commanded by the user through the interface 2, and if a solution is found by the constraint solver 3 with respect to the predetermined constraints, the spatialisation unit 5 modifies in real-time the musical information at its output, such that the spatial characteristics of the music reproduced by the sound reproducing device are changed in correspondence with the changes in the listener and/or sound sources' positions controlled by the user and the constraint solver 3.

The predetermined constraints used by the constraint solver 3 are now described.

In a general manner, there are a number n of sound sources in the musical setting. The respective positions of the sound sources in the two-dimensional referential (O, x, y) are designated by $p_l$ to $p_n$. The position of the listener in the same referential is designated by l. The positions $p_l$ to $p_n$ and l constitute the variables of the constraints.

The user can selectively activate or deactivate the predetermined constraints through the interface 2, and thus select those which should be taken into account by the constraint solver 3. For this purpose, there are provided icons 21 on the display 20 (see FIG. 3), on which the user can click by means of the mouse. Each icon 21 corresponds to a constraint. The user can activate one constraint, or several constraints simultaneously.

Each constraint does not necessarily involve all the variables (positions $p_l$ to $p_n$ and l), but can involve only some of them, the other being then free with respect to the constraint. Also, the constraints can involve the sound sources and the listener, or merely the sound sources. If no activated constraint is imposed on the position of the listener, the listener can be moved freely by the user to any position with respect to the sound sources. Then, each time the listener's position is moved by the user, the constraint solver 3 directly provides the new position to the command generator 4, without having to solve any constraints-based problem, and the spatialisation unit 5 is controlled so as to produce mixed musical information which corresponds to the music heard by the listener at his new position. In the same manner, if no activated constraint is imposed on a particular sound source, the latter can be moved freely by the user so as to modify the spatial characteristics of the music reproduced by the sound reproducing device.

Examples of constraints used in the present invention are listed below:

Related-objects constraint: this constraint specifies that the distance between each sound source involved by the constraint and the listener should always remain in the same ratio. The effect of this constraint is to ensure that when one of the sound sources is moved closer or further to the listener, the other sound sources are moved closer or further in a similar ratio in order to maintain the level balance constant between the sound sources. This constraint can be expressed as follows, for each sound source involved by the constraint:

$$\|p_i - l\| = \alpha_{i,j} \|p_j - l\|$$

where $p_i$ and $p_j$ are the positions of two different sound sources and the $\alpha_{ij}$ are predetermined constants.

Preferably, this constraint does not consider the position of the listener as a variable, but merely as a parameter. In other words, the position of the listener can be moved freely with respect to this constraint and the determination, by the constraint solver 3, of new positions for the sound sources is made based oil the current position 1 of the listener.

Anti-related (anti-link) objects constraint: this constraint specifies that the product of the distances between the sound sources involved by the constraint and the listener should remain constant. The effect of this constraint is to ensure that the global sound energy of the constrained sound sources remains constant. Thus, when a sound source is dragged closer to the listener, the other sound sources are moved further (and vice versa). This constraint can be expressed as follows (in the case where all sound sources are involved):

$$\prod_{i=1}^{n} \|p_i - l\| = Constant,$$

and can be approximated to:

$$\sum_{i=1}^{n} \|p_i - l\| = Constant.$$

Preferably, in practice, this constraint also considers the position of the listener as a parameter having a given value, and not as a variable whose value would have to be changed.

Radial-limit constraint: this constraint specifies a distance value from the listener that the sound sources involved by the constraint should never cross. Thus, it can be used as well as an upper or lower limit. The radial limits imposed for the respective sound sources can be defined, in the graphical representation shown by the display 20, by circles whose centre is the listener's graphical object. The spatialisation effect of this constraint is to ensure that the constraint sound sources' levels always remain within a certain range. This constraint can be expressed as follows, for each sound source involved by the constraint:

$\|pi - l\| \geqq \alpha_{inf-i}$, where $\alpha_{inf-i}$ designates a lower limit imposed for the sound source having the position $p_i$, and/or $\|pi-l\| \leqq \alpha_{sup-i}$, where $\alpha_{sup-i}$ designates an upper limit imposed for the sound source having the position $p_i$.

Angular constraint: this constraint specifies that the sound sources involved by the constraint should not cross an angular limit with respect to the listener.

The predetermined constraints used in the present invention are divided into two types of constraints, namely functional constraints and inequality constraints. Functional constraints can be expressed using an equality equation, such as X+Y+Z=Constant. Inequality constraints can be expressed using an inequality equation, such as X+Y+Z<Constant. The related-objects constraint and the anti-related objects constraints mentioned above are functional constraints, to whereas the radial-limit constraint and angular constraint are inequality constraints.

As previously explained, the constraint solver 3, receiving the new position of the listener or a sound source moved by the user, performs a propagation constraint-solving algorithm based oil the constraints that have been activated by the user. As an example, there is illustrated in FIG. 3 the function achieved by the constraint solver 3 when the anti-related objects constraint has been activated. In the example shown in FIG. 3, the user moves on the display 20 the graphical object representing the saxophone 12 towards the graphical object of the listener 13, as shown by arrow 120. The interface 2 transmits the changed position of the saxophone 12 to the constraint solver 3, which, in response, transmits new positions for the bass 10 and the drums 11 back to the interface 2. The new positions of the bass 10 and the drums 11 are determined such that the constraint activated by the user is satisfied. The interface 2 moves the bass 10 and the drums 11 on the display 20 in order to show to the user the new positions of these sound sources. In the example of the anti-related objects constraint, since the saxophone 12 is moved closer to the listener 13, the bass 10 and the drums 11 are moved further from the listener, as shown by arrows 100 and 110 respectively.

At the same time, the new positions found by the constraint solver 3 for the sound sources other than that moved by the user, namely the bass 10 and the drums 11, are provided by the constraint solver 3 to the command generator 4. The latter calculates numeric parameters depending on the positions of the various sound sources 10–12 of the musical setting and the listener 13, which numeric parameters are directly exploitable by the spatialisation unit 5. The spatialisation unit 5 then modifies the spatial characteristics of the music piece being produced by the musical setting as a function of the numeric parameters received from the command generator 4.

It may happen that the constrains solver 3 finds no solution to the constraints-based problem in response the moving of the listener or a sound source by the user. In such a case, the constraint solver 3 controls the interface 2 in such a way that the interface 2 displays a message on the display 20 for informing the user that the position change desired by the user cannot be satisfied in view of the activated constraints. The graphical object 10, 11, 12 or 13 that has been moved by the user on the display 20 as well as the corresponding element 10, 11, 12 or 13 in the referential (O, x, y) are then returned to their previous position, and the positions of the remaining elements (not moved by the user) are maintained unchanged.

As previously indicated, the algorithm used by the constraint solver 3 for determining new positions for the listener and/or sound sources in response to a position change by the user is a constraint propagation algorithm. In a general manner, this algorithm consists in propagating, in a recursive manner, the perturbation caused by the change of the value of a variable as controlled by the user towards the variables that are linked with this variable through constraints.

The algorithm according to the present invention differs from the conventional constraint propagation algorithms in that:

The inequality constraints are merely checked. If an inequality constraint is not satisfied, the algorithm is ended and a message "no solution found" is displayed on the display 20.

For each functional constraint, in response to the perturbation of one of the variables involved by the constraint, arbitrary new values are given to the other variables. Thus, a single arbitrary solution is determined for a given constraint (unlike the conventional constraint propagation algorithms which generally search for all solutions for a given constraint).

When a given variable has been perturbed, i.e. when its value has been changed by the user or an arbitrary new value has been given thereto by the algorithm, this variable is not perturbed again during the progress of the algorithm. For instance, if a variable is involved in two different constraints and an arbitrary new value is given to this variable in relation with the first one of the constraints, the algorithm cannot change the arbitrary new value already assigned to the variable in relation with the second one of the constraints. If the arbitrary new value that the algorithm would wish to give to the variable in relation with the second constraint is different from the arbitrary new value selected for satisfying the first constraint, then the algorithm is ended and a message "no solution found" is displayed on the display 20.

Figure 5A:
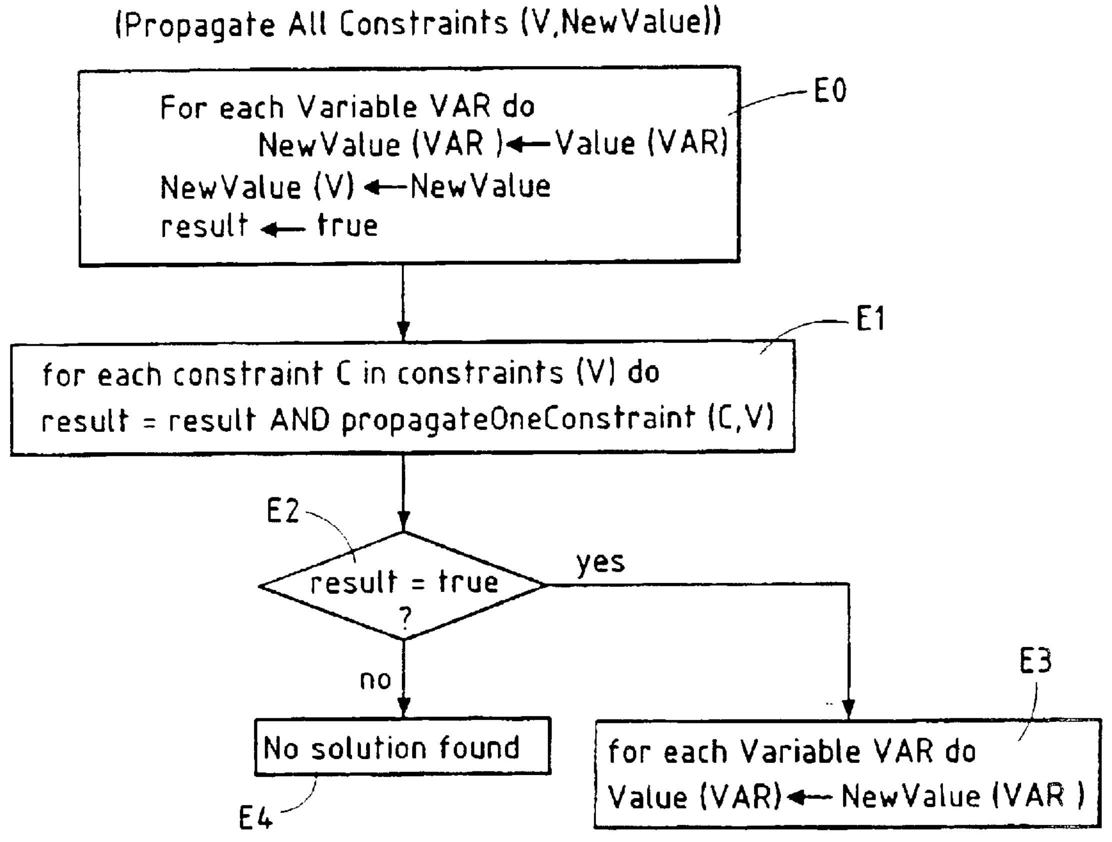
FIGS. 5A to 5E show a constraint propagation algorithm implemented in a constraint solver illustrated in FIG. 1.
Figure 5B:
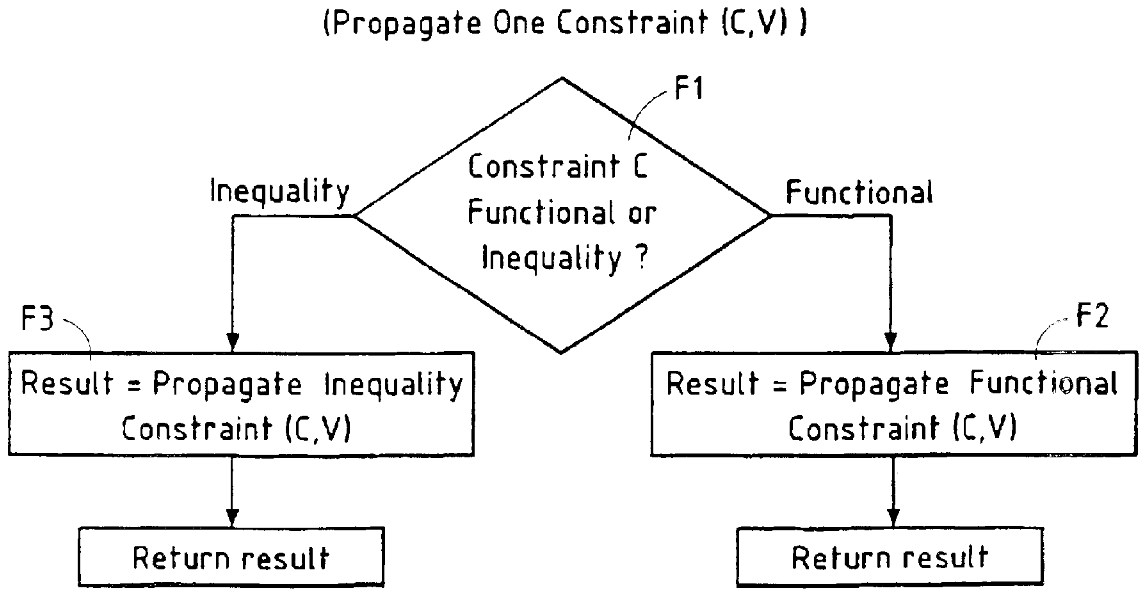
Figure 5C:
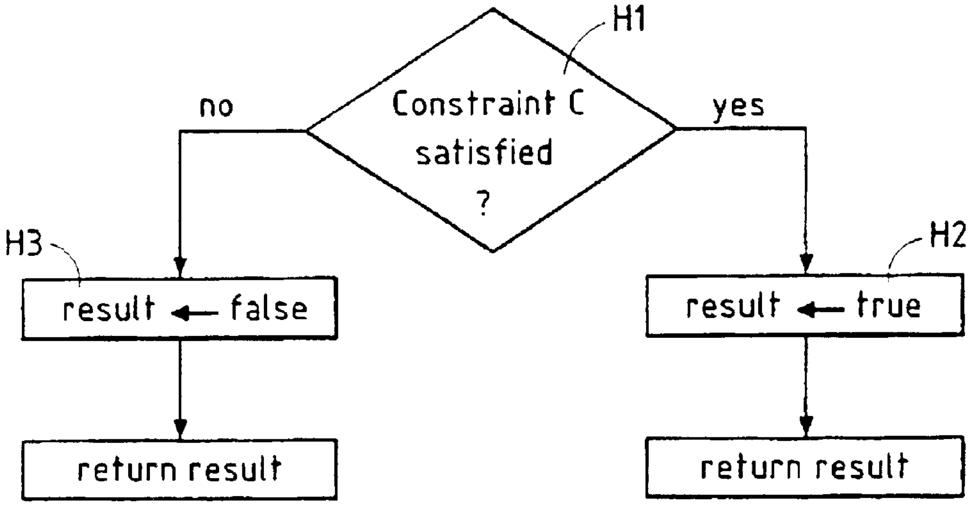
Figure 5D:
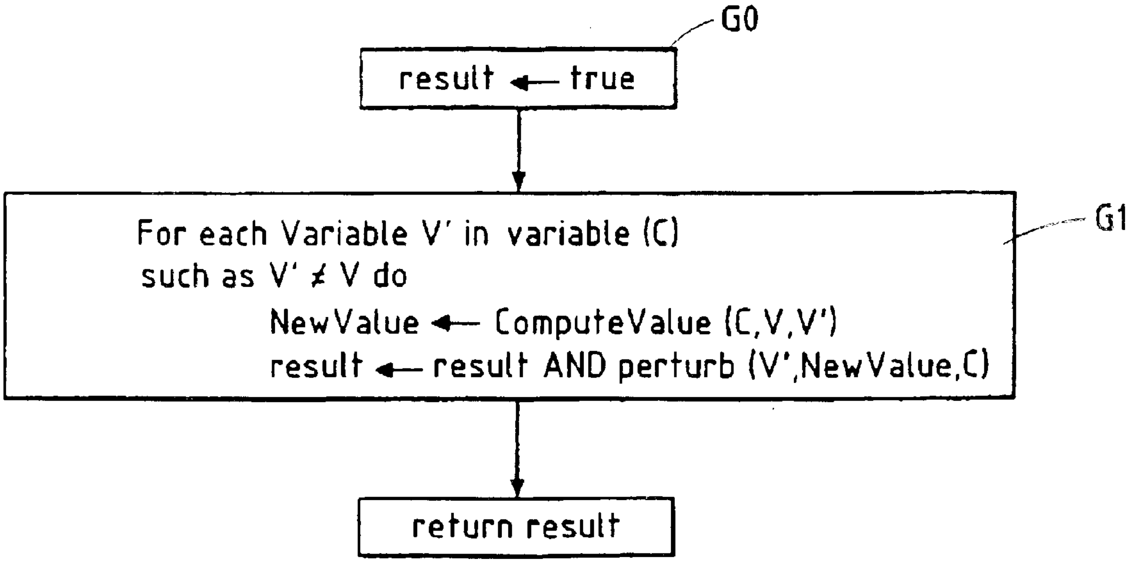
Figure 5E:
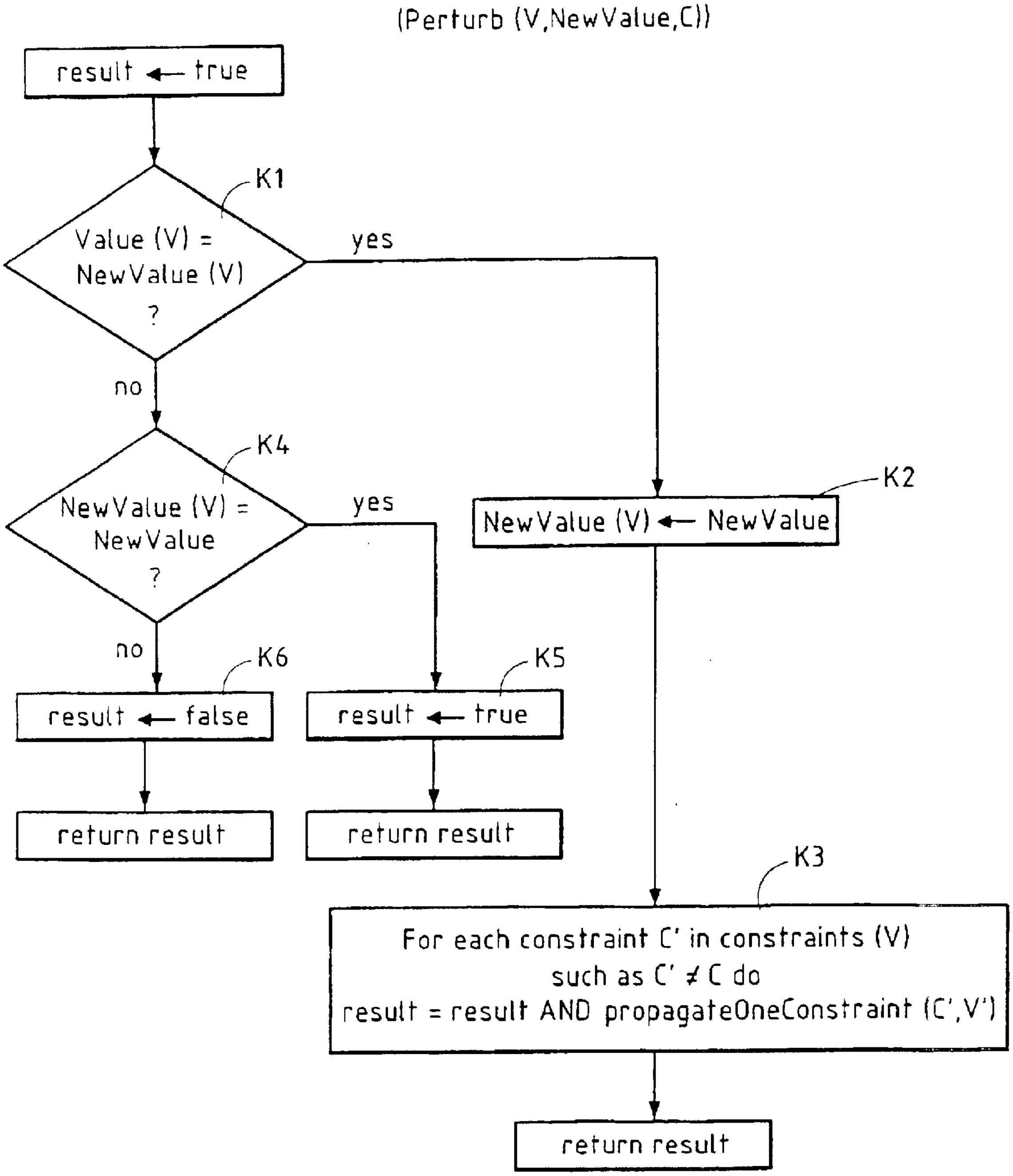

FIGS. 5A to 5E show in detail the recursive algorithm used in the present invention. More specifically:

FIG. 5A shows a procedure called "propagateAllConstraints" and having as parameters a variable V and a value NewValue;

FIG. 5B shows a procedure called "propagateOneConstraint" and having as parameters a constraint C and a variable V;

FIG. 5C shows a procedure called "propagateInequalityConstraint" and having as parameter a constraint C;

FIG. 5D shows a procedure called "propagateFunctionalConstraint" and having as parameters a constraint C and a variable V; and FIG. 5E shows a procedure called "perturb" and having as parameters a variable V, a value NewValue and a constraint C.

The procedure "propagateAllConstraints" shown in FIG. 5A constitutes the main procedure of the algorithm according to the present invention. The variable V contained in the set of parameters of this procedure corresponds to the position, in the referential (O,x,y), of the element (the listener or a sound source) that has been moved by the user. The value NewValue, also contained in the set of parameters of the procedure, corresponds to the value of this position once it has been modified by the user. At an initial step E0, the various local variables used in the procedure are initialised. At a following step E1, the procedure "propagateOneConstraint" is called for each constraint C in the set of constraints involving the variable V. If, at a step E2, a solution has been found to the constraints-based problem in such a way that all constraints activated by the user can be satisfied, the new positions of the sound sources and listener replace the corresponding original positions in the constraint solver 3 and are transmitted to the interface 2 and the command generator 4 at a step E3. If, on the contrary, no solution has been found at the step E2, the element moved by the user is returned to its original position, the positions of the other elements are maintained unchanged, and a message "no solution found" is displayed on the display 20 at a step E4.

In the procedure "propagateOneConstraint" shown in FIG. 5B, it is determined at a step F1 whether the constraint C is a functional constraint or an inequality constraint. If the constraint C is a functional constraint, the procedure "propagateFunctionalConstraint" is called at a step F2. If the constraint C is an inequality constraint, the procedure "propagateInequalityConstraint" is called at a step F3.

In the procedure "propagateInequalityConstraint" shown in FIG. 5C, the constraint solver 3 merely checks at a step H1 whether the inequality constraint C is satisfied. If the inequality constraint C is satisfied, the algorithm continues at a step H2. Otherwise, a Boolean variable "result" is set to FALSE at a step H3 in order to make the algorithm stop at the step E4 shown in FIG. 5A.

In the procedure "propagateFunctionalConstraint" shown in FIG. 5D, after an initialisation step G0, a step G1 is performed, wherein for each variable V' in the set of variables involved by the constraint C such as V' is different from V:

- a procedure called "ComputeValue" having as parameters the constraint C and the variables V and V' is called; and
- the procedure "perturb" is called based on a value "NewValue" calculated by the procedure "ComputeValue".

The role of the procedure "ComputeValue" is to give the variable V' an arbitrary value depending on the new value of the variable V and the constraint C, which is here a functional constraint. For simplification purposes, we will explain this procedure first in the general context of a constraint involving three given variables designated by X, Y and Z respectively. An example of a functional constraint linking the variables X, Y and Z is:

$$X+Y+Z=\text{Constant}.$$

If X is the variable whose value is modified by the user, the constraint solver 3 will have to modify the values of the variables Y and Z in order for the constraint to remain satisfied. For a given value of X, there are an infinite number of solutions for the variables Y and Z. According to the present invention, arbitrary value changes are applied respectively to the variables Y and Z as a function of the value change imposed by the user to the variable X, thereby determining one solution. For instance, if the value of the variable X is increased by a value δ, it can be decided to increase the respective values of the variables Y and Z each by the value δ/2.

Such arbitrary value changes are carried out in the present invention for non-binary constraints, i.e. constraints that involve more than two variables. In the case of a binary constraint, such as X+Y=Constant, the value of the variable other than that perturbed by the user can be determined directly as follows:

Y=Constant−X.

We will now describe the procedure "ComputeValue" in the case of the previously listed functional constraints relating to the positions of the sound sources, namely the related-objects constraint and the anti-related objects constraint.

When the constraint is the related-objects constraint, the procedure "ComputeValue" consists of calculating the following ratio:

$$\text{ratio}=\|\text{NewValue}(V)-S_o\|/\|\text{Value}(V)-S_o\|,$$

where NewValue (V) denotes the new value of the perturbed variable: V, value (V) the original value of the variable V, and $S_o$ the position of the listener. This ratio corresponds to the current distance between the sound source represented by the variable V and the listener divided by the original distance between the sound source represented by the variable V and the listener.

The value "NewValue" which is assigned to the variable V' is then calculated as follows:

$$\text{NewValue}=(\text{Value}(V')-S_o)\times\text{ratio}+S_o,$$

where Value (V') denotes the original value of the variable V'.

Thus, in response to a change of the value of the variable V, the value of the variable V' linked to the variable V by the related-objects constraint is changed in such a manner that the distance between the sound source represented by the variable V' and the listener is changed by the same ratio as that associated with the variable V.

When the constraint is the anti-related objects constraint, the procedure "ComputeValue" consists of:

calculating a ratio, which is the same ratio as described above, namely:

$$\text{ratio}=\|\text{NewValue}(V)-S_o\|/\|\text{Value}(V)-S_o, \text{ and}$$

calculating the new value for the variable V' as follows:

$$\text{NewValue}=(\text{Value}(V')-S_o)\times\text{ratio}^{1/(Nc-1)}+S_o,$$

where Nc is the number of variables involved by the constraint C.

Thus, in response to a change of the value of the variable V, each variable V' linked to the variable V by the anti-related objects constraint is given an arbitrary value in such a way that the product of the distances between the sound sources and the listener remains constant.

At the step G1 of the procedure, "propagateFunctionalConstraint", after a new value for a given variable V' is arbitrary set by the procedure "ComputeValue" as explained above, the procedure "perturb" is performed. The procedure "perturb" generally consists in propagating the perturbation from the variable V' to all the variables which are linked to the variable V' through constraints C' that are different from the constraint C.

FIG. 6 illustrates by way of example the function achieved by the procedure "perturb". In FIG. 6, three variables X, Y and Z are diagrammatically represented in the referential (O, x, y). The variables X, Y, Z are for instance linked to each other by a functional constraint C1 which specifies that the sum of these variables is equal to a constant (X+Y+Z=Constant). The value of the variable X is chanced by the user by a value δ. Using the procedure "ComputeValue", the value of the variable Y is then arbitrary chanced by a value δ/2. The variable Y may however be linked to other variables by predetermined constraints. For example, the variable Y can be linked to variables Y1 and Y2 by a constraint C2 and to a variable Y3 by a constraint C3. In response to the change of value of the variable Y by δ/2, the procedure "perturb" propagates the perturbation of the variable Y towards the variables Y1 and Y2 on the one hand, and the variable Y3 on the other hand. The propagation is performed recursively as will be explained herebelow. The variable Z shown in FIG. 6 is perturbed only after all the variables linked to the variable Y by constraints different from the constraint C1 have been considered (see step G1 of FIG. 5D). This approach is called a "depth first propagation" technique.

In the example of FIG. 6, there is also shown a constraint C4 which involves the variables Y3 and X. In response to the perturbation of the variable Y3 in relation with the constraint C3, the procedure "ComputeValue" for the constraint C4 will determine a new value for the variable X (with respect to its original value). If the new value for the variable X with respect to the constraint C4 is different from its current new value (the variable X has already been perturbed, by δ, and therefore a new value has been assigned to this variable before the constraint C4 is taken into account by the algorithm), the algorithm is terminated and a message "no solution found" is displayed on the display 20. In more general terms, according to the invention, when a variable has already been perturbed, by the user or by the algorithm, this variable is not perturbed again.

The various steps of the procedure "perturb" are disclosed in FIG. 5E with a variable V, a value "NewValue" calculated by the procedure "ComputeValue", and a constraint C as parameters. At a step K1, it is determined whether the variable V has already been perturbed (i.e. whether a new value has already been assigned to the variable before the calculation of said value "NewValue"). If the variable V has not yet been perturbed, then for each constraint C' in the constraints involving the variable V such as C' is different from the constraint C, the procedure "propagateOneConstraint" is called at a step K3. This corresponds, in FIG. 6, to the depth propagation performed in relation with the variable Y and the constraints C2 and C3.

If, at the step K1, it is determined that the variable V has already been perturbed, it is then checked, at a step K4, whether the parameter value "NewValue" calculated by the procedure "ComputeValue" for the variable V is the same as the new value assigned to the variable V during a previous perturbation. If the two values are the same, which means that the new value already assigned to the variable V during the previous perturbation is compatible with the current perturbation based on constraint C, a Boolean variable "result" is set to TRUE at a step K5 in order to continue the algorithm recursively. If the two variables are different, the Boolean variable "result" is set to FALSE at a step K6 in order to terminate the algorithm at the step E4 shown in FIG. 5A.

The algorithm according to the present invention has been described hereabove for a change, by the user, of the position of a graphical object on the display 20 from an original position to a new position. This new position is assumed to be close to the original position, such that the position change can be considered as a mere perturbation. In practice however, the user may wish to move a graphical object by a large amount. In this respect, the spatialisation system of the present invention samples the position change controlled by the user into several elementary position changes which each can be considered as a perturbation.

An illustration of this sampling is shown in FIG. 7. In FIG. 7, the reference numeral PT0 denotes the original position of a graphical object, and the reference numeral PT1 denotes the final position desired by the user. During the movement of the graphical object from PT0 to PT1, the constraint solver 3 is activated by the interface 2 each time the graphical object attains a sampled position $SP_m$, where m is an integer comprised within 1 and the number M of sampled positions between the original position PT0 and the final position PT1. Between a given sampled position $SP_m$ and its following position $SP_{m+1}$, the constraint solver 3 solves the constraints-based problem according to, the previously described algorithm, taking $SP_m$, as an original value for the variable associated with the graphical object and $SP_{m+1}$ as a new value. The user is thus given the impression that the spatialisation system according to the present invention reacts continuously. In the example shown in FIG. 3 with respect to the anti-related objects constraint, when the user moves the graphical object 12 in the direction of the arrow 120, the graphical objects 10 and 11 are quasi-simultaneously moved in the respective directions of arrows 100 and 110.

In a preferred embodiment of the present invention, the functions performed by the storage unit 1, the interface 2, the constraint solver 3, the command generator 4 and the spatialisation unit 5 are implemented in a same computer, although elements 1 to 5 could be implemented separately.

What is claimed is:

1. System for controlling a music spatialisation unit, characterised in that it comprises:

storage means for storing data representative of one or several sound sources and a listener of said sound sources, said data comprising position data corresponding to respective positions of the sound sources and the listener, interface means for enabling a user to select the listener or a sound source and to control a change in the position data corresponding to the selected listener or sound source, constraint solver means for changing, in response to the position data change controlled by the user, at least some of the position data corresponding to the element(s), among the listener and the sound sources, other than said selected listener or sound source, in accordance with predetermined constraints, said constraint solver means performing a constraint propagation algorithm having said position data as variables for changing said at least some of the position data, and means for delivering control data exploitable by a music spatialisation unit as a function of the position data corresponding to the sound sources and the listener;

wherein said predetermined constraints comprise functional and/or inequality constraints, and said constraint propagation algorithm is a recursive algorithm wherein:

inequality constraints are merely checked;

for each functional constraint, in response to a change in the value of one of the variables involved by the constraint, the other variables involved by the constraint are given arbitrary values such that the constraint be satisfied;

a variable that has been given an arbitrary value at a given step of the algorithm will not change value at any further step thereof; and if, at a given step of the algorithm, an inequality constraint is not satisfied, or a functional constraint cannot be satisfied in view of an arbitrary value previously given to one of its variables, the algorithm is ended and the position data chance controlled by the user is refused.

2. System according to claim 1, wherein said music spatialisation unit is a remote controllable mixing device.

3. System according to claim 1, wherein said interface means comprises a graphical interface for providing a graphical representation of the listener and the sound sources.

4. System according to claim 3, wherein said interface means comprises means for moving said listener and/or said sound sources in said graphical representation in response to the position data change controlled by the user and/or the position data change(s) performed by said constraint solver means.

5. System according to claim 1, wherein said interface means comprises means for enabling the user to selectively activate or deactivate said predetermined constraints.

6. System according to claim 1, wherein said interface means comprises means for sampling said position data change controlled by the user into elementary position data changes and for activating said constraint solver means each time an elementary position change has been controlled by the user.

7. System according to claim 1, wherein said predetermined constraints comprise at least one of the following constraints:

a constraint specifying that the respective distances between two given sound sources and the listener should always remain in the same ratio;

a constraint specifying that the product of the respective distances between each sound source and the listener should always remain constant;

a constraint specifying, that a given sound source should not cross a predetermined radial limit with respect to the listener; and a constraint specifying that a given sound source should not cross a predetermined angular limit with respect to the listener.

8. System according to claim 1, wherein said control data depend on the position of each sound source with respect to the listener.

9. System according to claim 1, wherein said control data comprise, for each sound source:

a volume parameter depending on the distance (d) between said each sound source and the listener, and a panoramic parameter depending on an angular position (β) of said each sound source with respect to the listener.

10. Music spatialisation system for controlling the spatial characteristics of a music produced by one or several sound sources, characterised in that it comprises:

a system according to claim 1 for producing control data depending on the respective positions of the sound sources and a listener of said sound sources, and a spatialisation unit for mixing predetermined musical data representative of music pieces respectively produced by said sound sources as a function of said control data.

11. System according to claim 10, further comprising a sound reproducing device for reproducing the mixed musical data produced by said spatialisation unit.

12. Method for controlling a music spatialisation unit, characterised in that it comprises the following steps:

storing data representative of one or several sound sources and a listener of said sound sources, said data comprising position data corresponding to respective positions of the sound sources and the listener, enabling a user to select the listener or a sound source and to control a change in the position data corresponding to the selected listener or sound source through an interface means, changing, in response to the position data change controlled by the user, at least some of the position data corresponding to the element(s), among the listener and the sound sources, other than said selected listener or sound source, in accordance with predetermined constraints, said changing step including performing a constraint propagation algorithm having said position data as variables for changing said at least some of the position data, and delivering control data exploitable by a music spatialisation unit as a function of the position data corresponding to the sound sources and the listener;

wherein said predetermined constraints comprise functional and/or inequality constraints, and said constraint propagation algorithm is a recursive algorithm wherein:

inequality constraints are merely checked;

for each functional constraint, in response to a change in the value of one of the variables involved by the constraint, the other variables involved by the constraint are given arbitrary values such that the constraint be satisfied;

a variable that has been given an arbitrary value of a given step of the algorithm will not change value at any further step thereof; and if, at a given step of the algorithm, an inequality constraint is not satisfied, or a functional constraint cannot be satisfied in view of an arbitrary value previously given to one of its variables, the algorithm is ended and the position data change controlled by the user is refused.

13. Method according to claim 12, wherein said music spatialisation unit is a remote controllable mixing device.

14. Method according to claim 12, further comprising the step of providing a graphical representation of the listener and the sound sources.

15. Method according to claim 14, further comprising the step of moving said listener and/or said sound sources in said graphical representation in response to the position data change controlled by the user and/or the position data change(s) performed by said changing step.

16. Method according to claim 12, further comprising the step of enabling the user to selectively activate or deactivate said predetermined constraints.

17. Method according to claim 12, further comprising the steps of sampling said position data change controlled by the user into elementary position data changes and activating said changing step each time an elementary position change has been controlled by the user.

18. Method according to claim 12, wherein said predetermined constraints comprise at least one of the following constraints:

a constraint specifying that the respective distances between two given sound sources and the listener should always remain in the same ratio;

a constraint specifying that the product of the respective distances between each sound source and the listener should always remain constant;

a constraint specifying that a given sound source should not cross a predetermined radial limit with respect to the listener; and a constraint specifying that a given sound source should not cross a predetermined angular limit with respect to the listener.

19. Method according to claim 12, wherein said control data depend on the position of each sound source with respect to the listener.

20. Method according to claim 12, wherein said control data comprise, for each sound source:

a volume parameter depending on the distance (d) between said each sound source and the listener, and a panoramic parameter depending on an angular position (β) of said each sound source with respect to the listener.

21. Music spatialisation method for controlling the spatial characteristics of a music produced by one or several sound sources, characterised in that it comprises:

a method according to claim 12 for producing control data depending on the respective positions of the sound sources and a listener of said sound sources, and a spatialisation step for mixing predetermined musical data representative of music pieces respectively produced by said sound sources as a function of said control data.

22. Method according to claim 21, further comprising the step of reproducing the mixed musical data produced by said spatialisation step.

* * * * *